(12) United States Patent
Li

(10) Patent No.: US 11,468,920 B2
(45) Date of Patent: Oct. 11, 2022

(54) SEMICONDUCTOR CONNECTION STRUCTURE AND METHOD FOR MANUFACTURING THE SAME

(71) Applicant: Winbond Electronics Corp., Taichung (TW)

(72) Inventor: Chun-Lin Li, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 136 days.

(21) Appl. No.: 17/168,412

(22) Filed: Feb. 5, 2021

(65) Prior Publication Data

US 2022/0254381 A1 Aug. 11, 2022

(51) Int. Cl.
*G11C 5/06* (2006.01)
*H01L 23/528* (2006.01)
*H01L 23/522* (2006.01)
*H01L 27/108* (2006.01)

(52) U.S. Cl.
CPC .......... *G11C 5/063* (2013.01); *H01L 23/5226* (2013.01); *H01L 23/5283* (2013.01); *H01L 27/10891* (2013.01)

(58) Field of Classification Search
CPC . G11C 5/063; H01L 23/5226; H01L 23/5283; H01L 27/10891
See application file for complete search history.

(56) References Cited

U.S. PATENT DOCUMENTS

| | | | |
|---|---|---|---|
| 2001/0055848 A1 | 12/2001 | Minn et al. | |
| 2006/0289918 A1 | 12/2006 | McDaniel et al. | |
| 2011/0303963 A1 | 12/2011 | Kim | |
| 2018/0286481 A1* | 10/2018 | Nagai | G11C 29/824 |
| 2019/0198502 A1* | 6/2019 | Huang | H01L 27/10891 |

FOREIGN PATENT DOCUMENTS

| | | |
|---|---|---|
| JP | 2009049235 A | 3/2009 |
| KR | 20020047228 A | 6/2002 |

* cited by examiner

*Primary Examiner* — Karen Kusumakar
(74) *Attorney, Agent, or Firm* — Muncy, Geissler, Olds & Lowe, P.C.

(57) ABSTRACT

A semiconductor connection structure and its manufacturing method are provided. The semiconductor connection structure includes a substrate with an array area, a first trench, a metal line, a work function layer and a contact structure. The array area includes a central region and an edge region surrounding the central region. The first trench is formed in the substrate and extends from the central region to the edge region along a first direction. The first trench has a first portion in the central region and a wider second portion in the edge region. The metal line and the work function layer are formed in the first trench. The contact structure is formed in the first trench within the edge region. The contact structure is located on the metal line and in direct contact with the metal line. The bottom portion of the contact structure is surrounded by the work function layer.

12 Claims, 10 Drawing Sheets

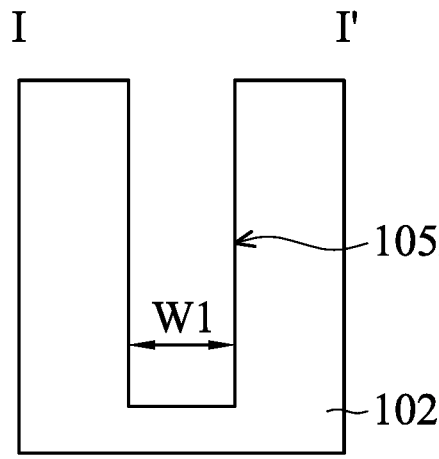
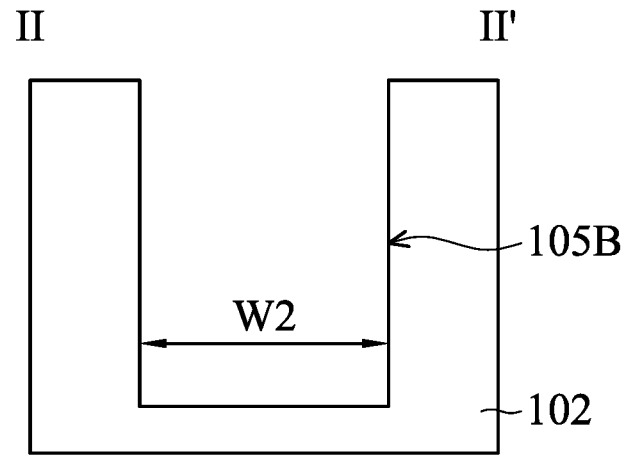
FIG. 1A
FIG. 1B
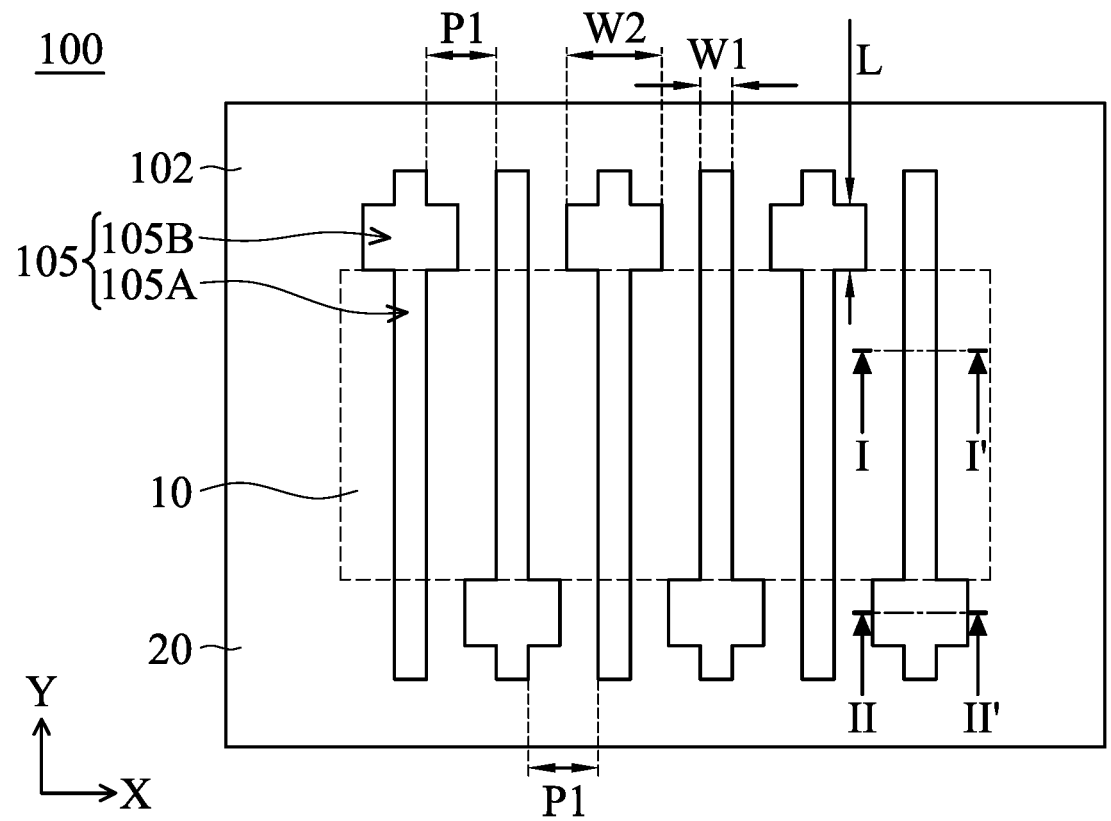
FIG. 1C

SEMICONDUCTOR CONNECTION STRUCTURE AND METHOD FOR MANUFACTURING THE SAME

BACKGROUND OF THE INVENTION

Field of the Invention

The present invention relates to a memory device, and in particular it relates to a semiconductor connection structure and its manufacturing method.

Description of the Related Art

As commercial electronic products become smaller, memory devices used therein must likewise become miniaturized. However, with the miniaturization of memory devices, it has become more difficult to improve the yield and reliability of the memory devices.

For example, in a dynamic random access memory (DRAM) with buried word lines, a word line contact structure is usually formed at the boundary region between the array area and the peripheral area. In order to reduce the electrical resistance value and improve the performance of the device, the word line contact structure is usually in direct contact with the buried word line. Therefore, before forming the word line contact holes, it is necessary to use a photomask for a lithography process to remove the work function layer above the buried word line in the boundary region. Furthermore, in the conventional lithography process for partially removing the work function layer, if the size of the word line contact hole is too small, it may not be completely exposed. Therefore, the word line contact structure cannot be formed or fails. As a result, the yield and reliability of the memory device will be reduced. On the other hand, if the size of the word line contact hole is too large, adjacent word line contact holes may be connected to each other and cause a short circuit. As a result, the yield and reliability of the memory device will also be reduced. In addition, the position where the above-mentioned word line contact structure fails or short circuits cannot be predicted. Therefore, when the critical dimension is very small, the lithography process for removing the work function layer becomes very difficult to control, and the process complexity and cost are very high. With the miniaturization of memory devices, the above-mentioned problems will become more serious.

Therefore, in the technical field, there is still a need for dynamic random access memory with high yield and high reliability, and there is also a need for a method for forming such a dynamic random access memory.

BRIEF SUMMARY OF THE INVENTION

The embodiments of the present invention provide a semiconductor connection structure and a manufacturing method thereof, which can form contact holes at specific positions in a self-aligned manner. Therefore, when the method for manufacturing the semiconductor connection structure provided by the embodiment of the present invention is applied to a dynamic random access memory having buried word lines, the lithography process and the photomask for partially removing the work function layer can be omitted, and the word line contact hole can be formed at the required position. As a result, the yield and reliability of the memory device can be greatly improved, and the process complexity and manufacturing cost of the memory device can be reduced.

In accordance with some embodiments of the present disclosure, a semiconductor connection structure is provided. The semiconductor connection structure includes a substrate, a first trench, a metal line, a work function layer, and a contact structure. The substrate includes an array area. The array area includes a central region and an edge region surrounding the central region. The first trench is formed in the substrate, and the first trench extends from the central region to the edge region along a first direction. The first trench has a first portion in the central region, the first trench has a second portion in the edge region, and a first width of the first portion is smaller than a second width of the second portion. The metal line is formed in the first trench. The work function layer is formed in the first trench and is located on the metal line. The contact structure is formed in the first trench within the edge region. The contact structure is located on the metal line and is in direct contact with the metal line. A bottom portion of the contact structure is surrounded by the work function layer.

In accordance with some embodiments of the present disclosure, a method for manufacturing a semiconductor connection structure is provided. The method includes providing a substrate comprising an array area. The array area includes a central region and an edge region surrounding the central region. The method includes forming a first trench in the substrate. The first trench extends from the central region to the edge region along a first direction. The first trench has a first portion in the central region, the first trench has a second portion in the edge region, and a first width of the first portion is smaller than a second width of the second portion. The method includes forming a metal line in the first trench. The method includes forming a work function layer in the first trench. The work function layer is located on the metal line. The method includes forming a contact structure in the first trench within the edge region. The contact structure is located on the metal line and is in direct contact with the metal line. A bottom portion of the contact structure is surrounded by the work function layer.

BRIEF DESCRIPTION OF THE DRAWINGS

A detailed description is given in the following embodiments with reference to the accompanying drawings. It should be emphasized that many features are not drawn to scale according to industry standard practice. In fact, the dimensions of the various components may be arbitrarily increased or decreased for clarity of discussion.

FIG. 1A, FIG. 1B.

FIG. 1C, FIG. 2C, FIG. 3C, FIG. 4C, FIG. 5C, and FIG. 6C are top views corresponding to various steps of manufacturing a semiconductor connection structure in accordance with one embodiment of the present invention.

DETAILED DESCRIPTION OF THE INVENTION

Figure 2A:
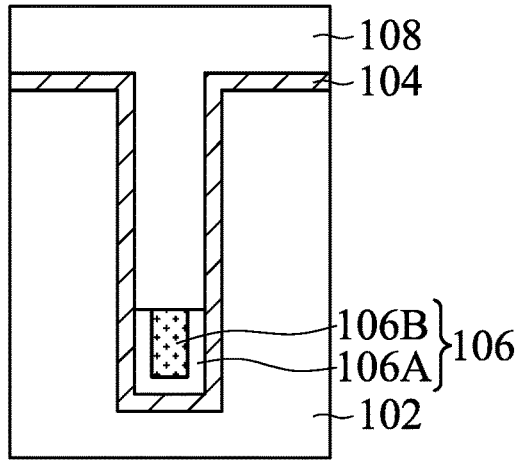
FIG. 2A, FIG. 2B, FIG. 3A, FIG. 3B, FIG. 4A, FIG. 4B, FIG. 5A, FIG. 5B, FIG. 6A, and FIG. 6B, are cross-sectional views corresponding to various steps of manufacturing a semiconductor connection structure in accordance with one embodiment of the present invention.

The present disclosure is best understood from the following detailed description when read with the accompanying figures. Furthermore, the present disclosure may repeat reference numerals and/or letters in the various examples. This repetition is for the purpose of simplicity and clarity and does not in itself dictate a relationship between the various embodiments and/or configurations discussed.

In the disclosure, the term "about" or "approximately" means in a range of 20% of a given value or range, preferably 10%, and more preferably 5%. In the disclosure, if there is no specific explanation, a given value or range means an approximate value which may imply the meaning of "about" or "approximately".

A method for manufacturing a semiconductor connection structure is provided in some embodiments of the present invention. FIG. 1C, FIG. 2C, FIG. 3C, FIG. 4C, FIG. 5C, and FIG. 6C are top views corresponding to various steps of manufacturing a semiconductor connection structure 100 in accordance with one embodiment of the present invention. FIG. 1A, FIG. 2A, FIG. 3A, FIG. 4A, FIG. 5A, and FIG. 6A are cross-sectional views taken along line I-I' of FIG. 1C, FIG. 2C, FIG. 3C, FIG. 4C, FIG. 5C, and FIG. 6C, respectively. FIG. 1B, FIG. 2B, FIG. 3B, FIG. 4B, FIG. 5B, and FIG. 6B, are cross-sectional views taken along line II-II' of FIG. 1C, FIG. 2C, FIG. 3C, FIG. 4C, FIG. 5C, and FIG. 6C, respectively.

The semiconductor connection structure 100 may be applied to any suitable semiconductor device. For example, in one embodiment, the semiconductor connection structure 100 is applied to a dynamic random access memory, and the semiconductor connection structure 100 is used as a buried word line or a buried bit line. In order to facilitate the description, in the following, one embodiment using the semiconductor connection structure 100 as a buried word line will be described.

Referring to FIG. 1A to FIG. 1C simultaneously, a substrate 102 including an array area is provided, and the array area includes a central region 10 and an edge region 20 surrounding the central region 10. Furthermore, the substrate 102 includes a peripheral area (not shown) surrounding the array area. Therefore, the edge region 20 is located at the boundary between the array area and the peripheral area. The word line contact structure is usually formed in the edge region 20. The material of the substrate 102 may include silicon, silicon-containing semiconductor, silicon on insulator (SOI), other suitable materials, or a combination thereof. In the present embodiment, the substrate 102 is a silicon substrate. In one embodiment, a shallow trench isolation structure may be formed in the substrate 102. In one embodiment, other structures may also be formed in the substrate 102. For example, a source region, a drain region, a p-type well region, an n-type well region, or a conductive region may be formed in the substrate 102 by an implantation process. In order to simplify the description, the above-mentioned shallow trench isolation structure and other structures are not shown in the drawings, and the structures in the substrate 102 and the formation method thereof will not be described in detail here.

Then, a first etching process is performed to form a plurality of first trenches 105 in the substrate 102. The first trenches 105 are arranged substantially in parallel and extend from the central region 10 to the edge region 20 along the first direction (i.e., the Y direction in FIG. 1C). Subsequently, the buried word line 106 (shown in FIG. 2A and FIG. 2B) will be formed in the first trench 105. Therefore, in the present specification, the first trench 105 may also be referred to as the "word line trench 105". Similarly, in the present specification, the trenches 205, 305, and 405 mentioned later may also be referred to as the word line trenches 205, 305, and 405. The first trench 105 has a first portion 105A in the central region 10, and the first trench 105 has a second portion 105B in the edge region 20. In the second direction (i.e., the X direction in FIG. 1C), the first portion 105A has a first width W1, the second portion 105B has a second width W2, and the first width W1 is smaller than the second width W2. In the first direction, the second portion 105B having the second width W2 has a length L, and the length L is greater than the first width W1. In FIG. 1C, the second portion 105B is approximately rectangular in shape, and extends outward along the second direction from both sides of the first trench 105. The first etching process may include an anisotropic etching process. In the present embodiment, the first etching process is a dry etching process.

Figure 2B:
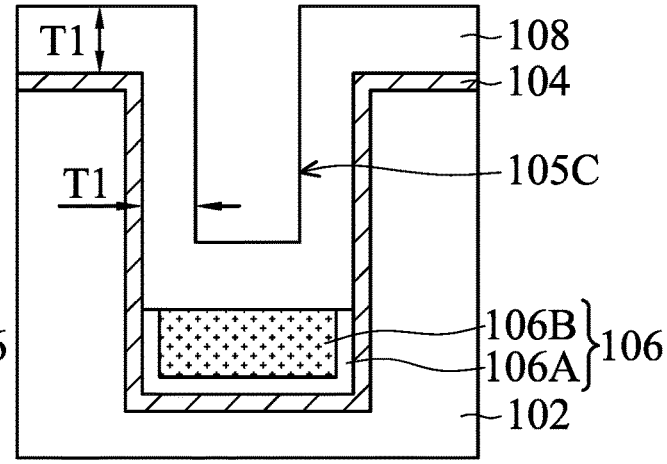
Figure 2C:
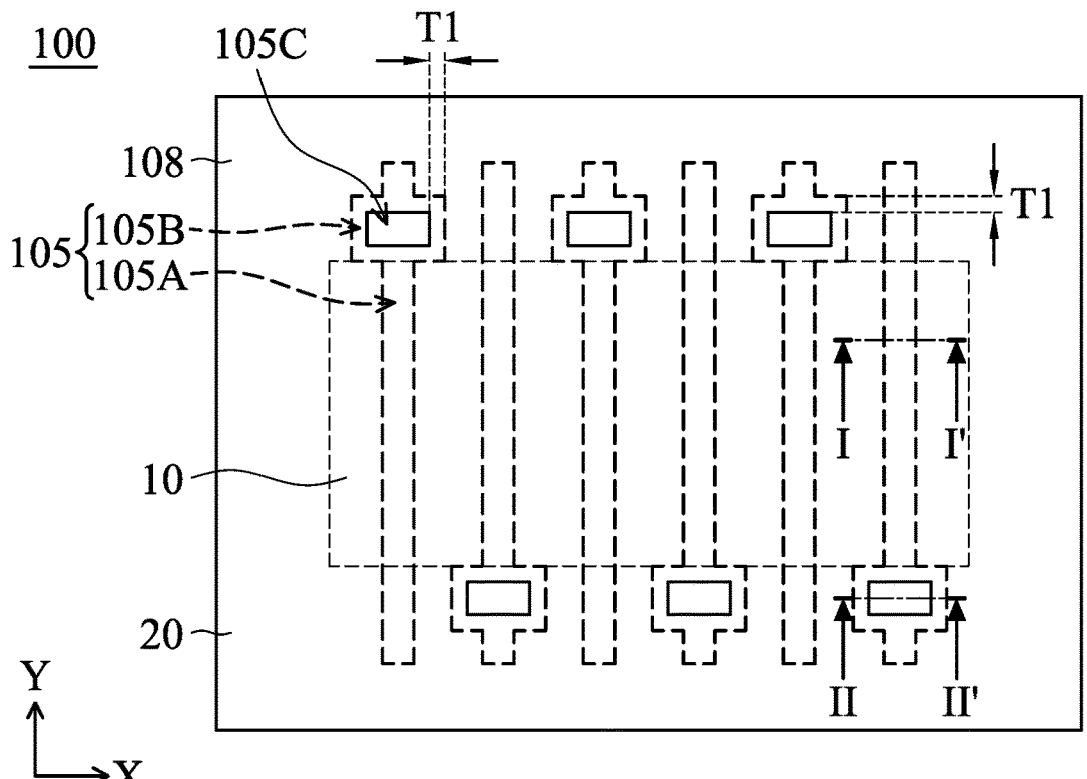

Referring to FIG. 2A to FIG. 2C simultaneously, an insulating liner 104 is conformally formed on the substrate 102 and the first trench 105. The insulating liner 104 may include oxide, nitride, oxynitride, carbide, or a combination thereof. In the present embodiment, the insulating liner 104 is silicon oxide formed by thermal oxidation.

Next, a first conductive layer 106A is conformally formed on the substrate 102 and the first trench 105. Then, a second conductive layer 106B is formed to fill the first trench 105. The material of the first conductive layer 106A may include titanium, titanium nitride, tungsten nitride, tantalum, tantalum nitride, or a combination thereof. The material of the second conductive layer 106B may include tungsten, aluminum, copper, gold, silver, an alloy thereof, or a combination thereof. The first conductive layer 106A and the second conductive layer 106B may be independently formed by a chemical vapor deposition process, a physical vapor deposition process, an atomic layer deposition process, or other suitable deposition processes. In the present embodiment, the first conductive layer 106A is titanium nitride, and the second conductive layer 106B is tungsten.

The second width W2 of the second portion 105B is greater than the first width W1 of the first portion 105A. Therefore, after the second conductive layer 106B has completely filled the first trenches 105, the top surface of the second conductive layer 106B in the second portion 105B will be lower than the top surface of the second conductive layer 106B in the first portion 105A. A planarization process (for example, a chemical mechanical polishing process) may be performed so that the second conductive layer 106B on the substrate 102 has a substantially flat top surface. In other words, the top surface of the second conductive layer 106B located in the second portion 105B and the top surface of the second conductive layer 106B located in the first portion 105A are level with each other. Then, the first conductive layer 106A and the second conductive layer 106B may be etched to a desired thickness by a second etching process, as shown in FIG. 2A and FIG. 2B. The second etching process may include an anisotropic etching process. In the present embodiment, the second etching process is a dry etching process. In one embodiment, the first conductive layer 106A and the second conductive layer 106B are formed in the substrate 102 and can be used as word lines. Therefore, in the present specification, the first conductive layer 106A and the second conductive layer 106B may be collectively referred to as the "buried word line 106". Furthermore, the main material of the second conductive layer 106B is metal.

Therefore, the second conductive layer 106B may also be referred to as the "metal line 106B".

Then, a work function layer 108 is conformally formed on the substrate 102 and the metal line 106B, and the work function layer 108 is filled into the first trench 105. The material of the work function layer 108 may include doped polycrystalline silicon, doped single crystalline silicon, or a combination thereof. The work function layer 108 may be formed by a chemical vapor deposition process, a physical vapor deposition process, an atomic layer deposition process, or a combination thereof. In the present embodiment, the material of the work function layer 108 is doped polycrystalline silicon. The work function of the work function layer 108 may be controlled by adjusting the type and concentration of dopants. Therefore, the gate-induced drain leakage current (GIDL) of the memory cell located in the central region 10 can be reduced.

Still referring to FIG. 2A to FIG. 2C simultaneously, the second width W2 of the second portion 105B is greater than the first width W1 of the first portion 105A. Therefore, after the work function layer 108 has completely filled the first portion 105A of the first trench 105, the work function layer 108 does not completely fill the second portion 105B of the first trench 105. In other words, the work function layer 108 forms a recess 105C in the second portion 105B. In FIG. 2C, the surface of the substrate 102 has been completely covered by the work function layer 108. In FIG. 2C and other drawings, when the first trench 105 is completely covered, in order to easily distinguish the first trench 105, the position and shape of the first trench 105 are marked with a dotted line.

Figure 3A:
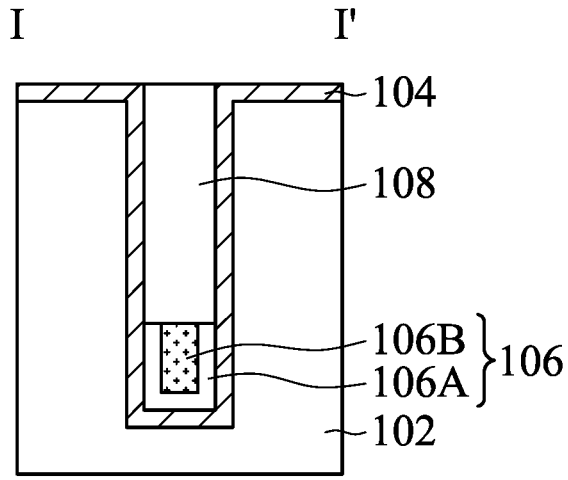
Figure 3B:
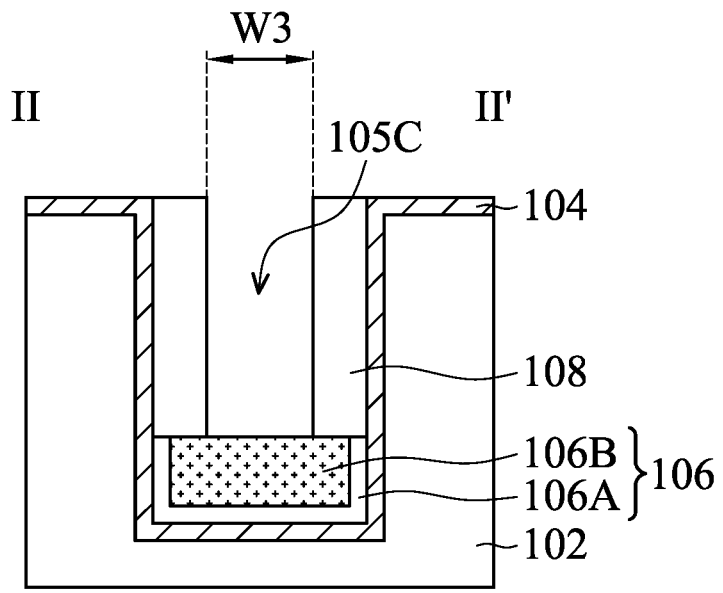
Figure 3C:
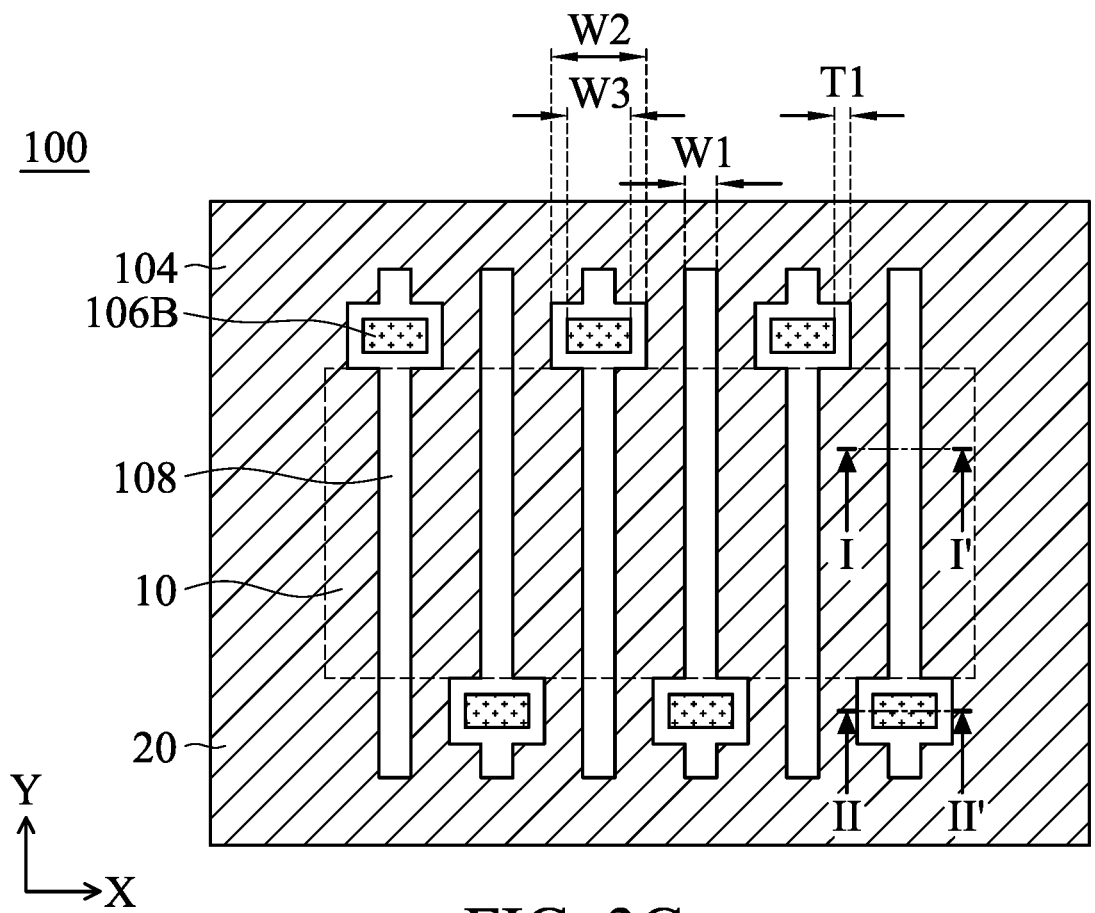

Referring to FIG. 3A to FIG. 3C simultaneously, a third etching process is performed to partially remove the work function layer 108. In the present embodiment, after the third etching process, the work function layer 108 located outside the first trench 105 and located at the bottom of the recess 105C is removed, and the metal line 106B located under the recess 105C is exposed. In other embodiments, after the third etching process, a portion of the work function layer 108 remains at the bottom of the recess 105C, so the underlying metal line 106B is not exposed. In such embodiments, the metal line 106B located under the recess 105C may be exposed after the subsequent fourth etching process is performed.

The third etching process may include an anisotropic etching process. In the present embodiment, the third etching process is a dry etching process. During the third etching process, the removal rate of the insulating liner 104 is much lower than the removal rate of the work function layer 108. Therefore, the insulating liner 104 can be used as an etch stop layer. In one embodiment, during the third etching process, the ratio R1/R2 of the removal rate R1 of the work function layer 108 to the removal rate R2 of the insulating liner 104 is 5.0-20.0. In the present embodiment, after the third etching process, the top surface of the work function layer 108 is substantially level with the top surface of the insulating liner 104.

Figure 4A:
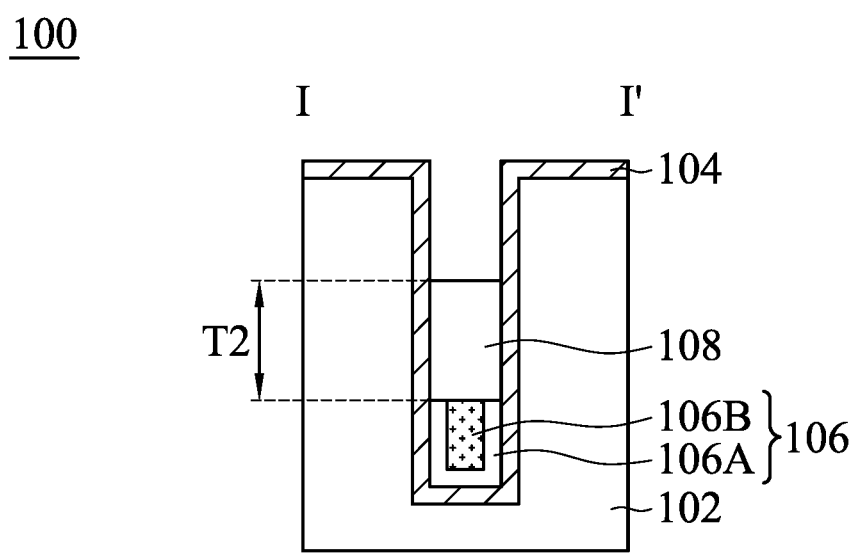
Figure 4B:
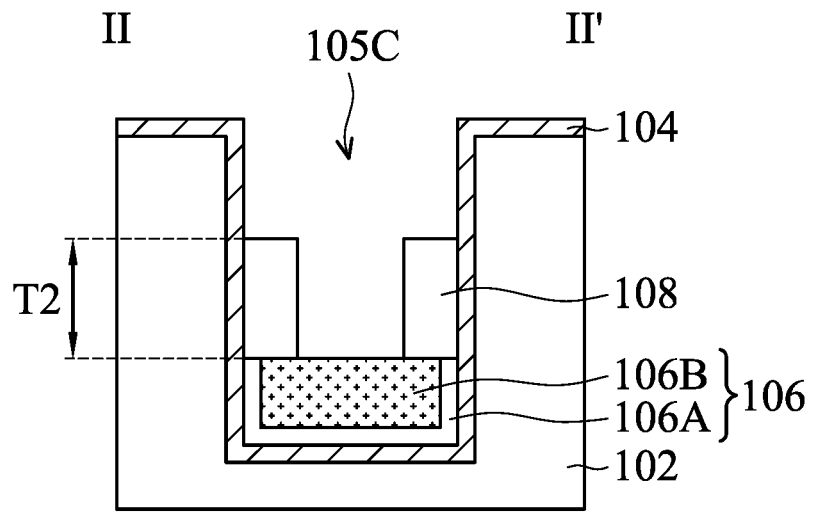
Figure 4C:
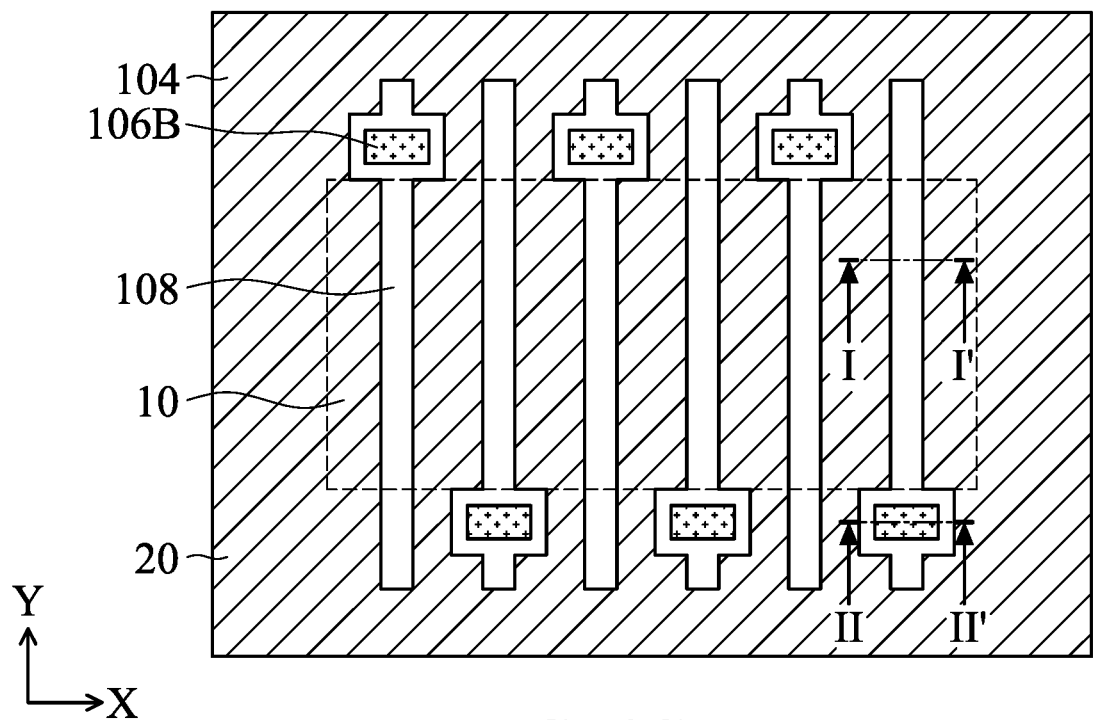

Referring to FIG. 4A to FIG. 4C simultaneously, a fourth etching process is performed to partially remove the work function layer 108 and reduce the height of the work function layer 108. During the fourth etching process, a portion of the work function layer 108 in the first trench 105 is removed, and a portion of the work function layer 108 is left in the first trench 105. After the fourth etching process, the work function layer 108 located in the first portion 105A still completely covers the metal line 106B. Furthermore, the work function layer 108 located in the second portion 105B does not completely cover the metal line 106B, and exposes a portion of the top surface of the metal line 106B. The fourth etching process may be the same or similar to the third etching process.

Figure 5A:
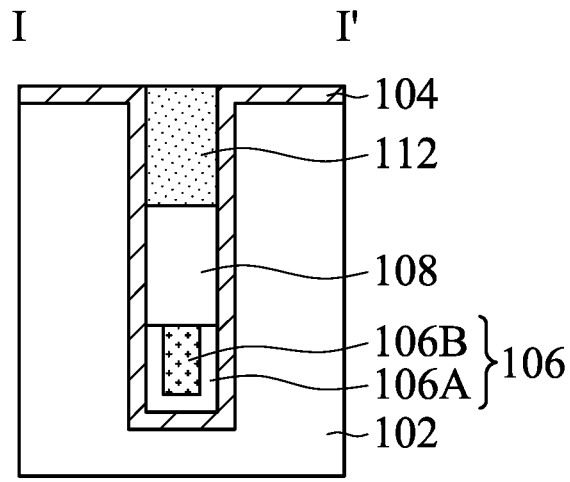
Figure 5B:
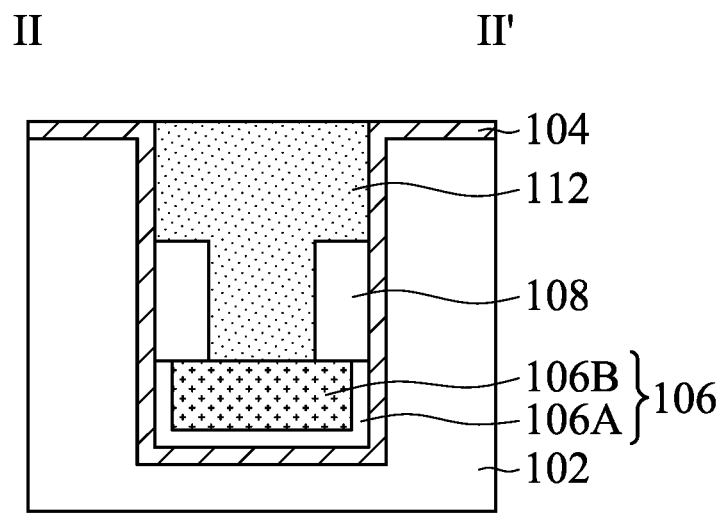
Figure 5C:
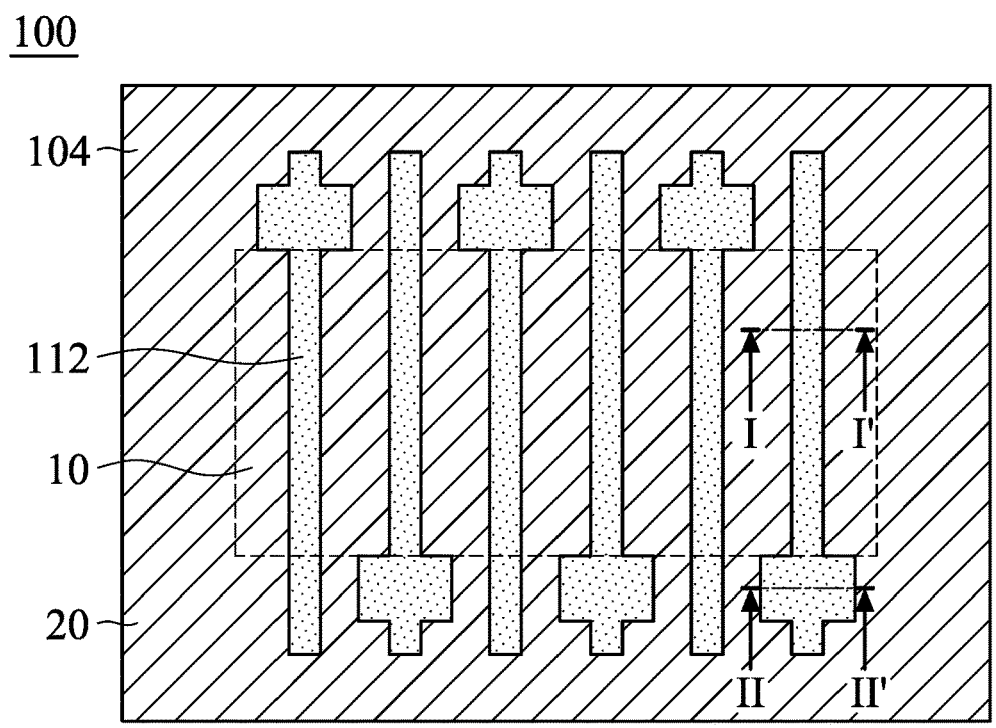

Referring to FIG. 5A to FIG. 5C simultaneously, the first trench 105 is completely filled with an insulating material, and the excess insulating material is removed by a planarization process (for example, a chemical mechanical polishing process) to form an insulating capping layer 112 in the first trench 105. The insulating capping layer 112 is located on the work function layer 108 and is in direct contact with the work function layer 108. The material of the insulating capping layer 112 may include oxide, nitride, oxynitride, or a combination thereof. The insulating capping layer 112 may be formed by a chemical vapor deposition process, a physical vapor deposition process, an atomic layer deposition process, or a combination thereof. In the present embodiment, the insulating capping layer 112 is silicon nitride. In the present embodiment, after planarization, the top surface of the insulating capping layer 112 is substantially level with the top surface of the insulating liner 104.

Figure 6A:
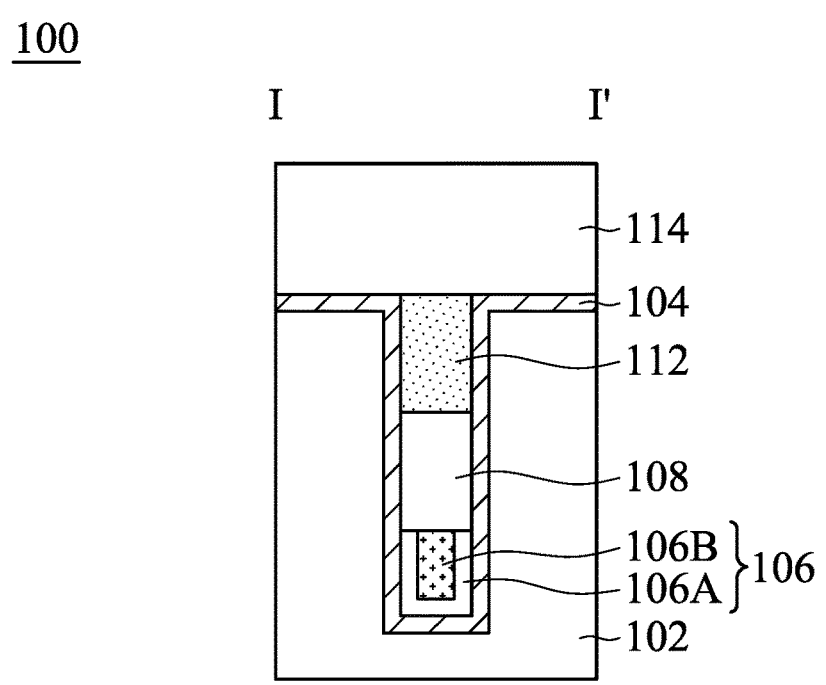
Figure 6B:
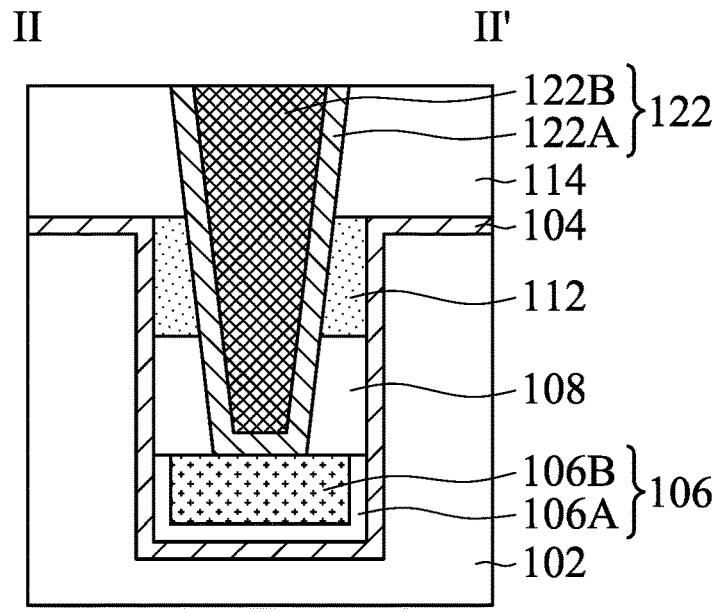
Figure 6C:
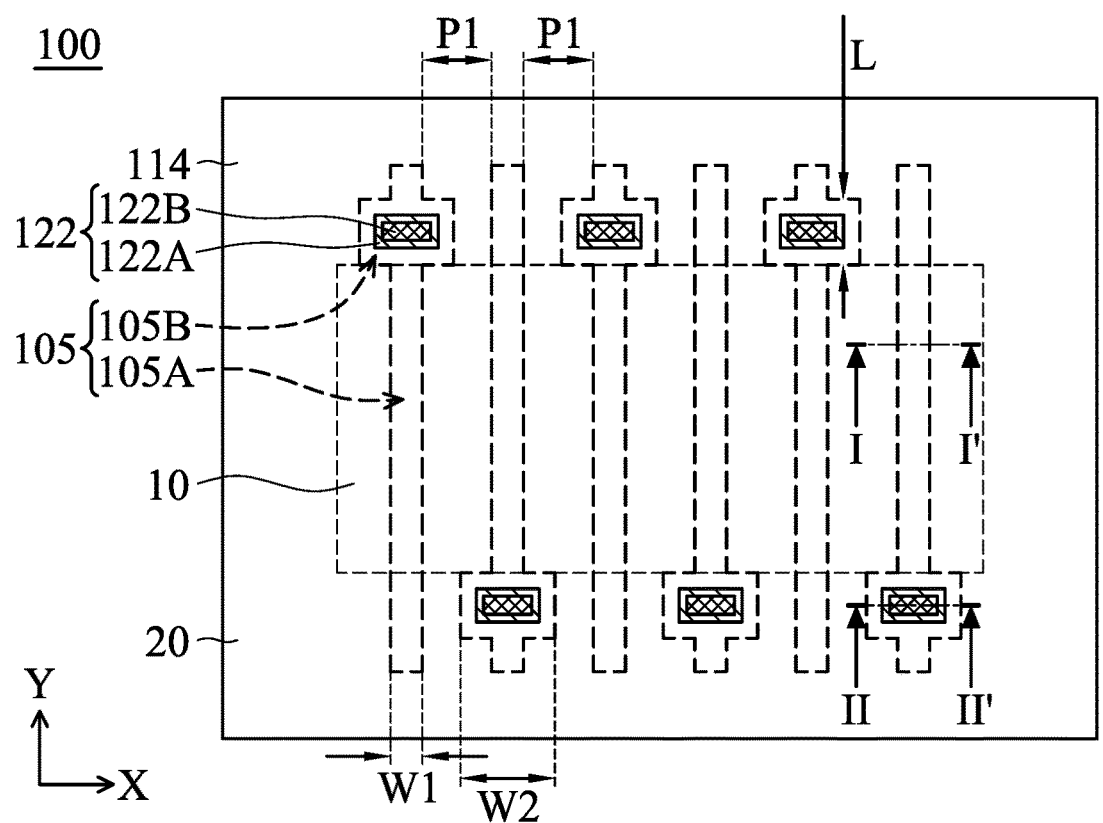

Referring to FIG. 6A to FIG. 6C simultaneously, an insulating layer 114 is formed on the substrate 102. The material of the insulating layer 114 may include oxide, nitride, oxynitride, carbide, or a combination thereof. The insulating layer 114 may be formed by a chemical vapor deposition process, a physical vapor deposition process, an atomic layer deposition process, or a combination thereof. In the present embodiment, the insulating layer 114 is silicon nitride. In other embodiments, the insulating layer 114 has a dual-layer structure formed of silicon nitride and silicon oxide formed on the silicon nitride.

Then, a contact structure 122 is formed in the first trench 105 of the edge region 20. More specifically, a fifth etching process may be performed on the insulating layer 114 and the insulating capping layer 112 to define a contact hole (not shown) passing through the insulating layer 114 and the insulating capping layer 112 in the edge region 20. The position of the contact hole corresponds to the position of the recess 105C, and the contact hole exposes the metal line 106B. The fifth etching process may include an anisotropic etching process. In the present embodiment, the fifth etching process is a dry etching process. During the fifth etching process, the removal rate of the work function layer 108 is much lower than the removal rate of the insulating layer 114 and the removal rate of the insulating capping layer 112. Therefore, the contact hole can be formed in the position corresponding to the recess 105C in a self-aligned manner, thereby increasing the margin of the manufacturing process. In one embodiment, during the fifth etching process, the ratio R3/R4 of the removal rate R3 of the insulating capping layer 112 to the removal rate R4 of the work function layer 108 is 5.0-20.0. In the present embodiment, after the fifth etching process, the top surface of the metal line 106B is exposed in the edge region 20.

Next, a third conductive layer 122A is conformally formed on the substrate 102 and the contact hole. Then, a fourth conductive layer 122B is formed to fill the contact hole. Then, a planarization process (for example, a chemical mechanical polishing process) may be performed as needed to make the top surface of the third conductive layer 122A, the top surface of the fourth conductive layer 122B, and the top surface of the insulating layer 114 coplanar. The material and forming method of the third conductive layer 122A are similar to the first conductive layer 110A, and the material and forming method of the fourth conductive layer 122B are similar to the second conductive layer 110B. Therefore, the details will not be described herein. In the present embodiment, the third conductive layer 122A is titanium nitride, and the fourth conductive layer 122B is tungsten. In one embodiment, the contact structure 122 is used to electrically connect the buried word line 106 with other components. Therefore, in the present specification, the third conductive layer 122A and the fourth conductive layer 122B may be collectively referred to as the "contact structure 122" or the "word line contact structure 122".

After the contact structure 122 is formed, other conventional processes may be subsequently performed or other conventional elements may be subsequently formed to complete the semiconductor device including the semiconductor connection structure 100. For example, when the above-mentioned semiconductor device including the semiconductor connection structure 100 is a dynamic random access memory, a bit line, a bit line contact structure, a capacitor structure, a capacitor contact structure and/or a connection pad may be formed on the substrate 102. In order to simplify the description, other conventional manufacturing processes and elements will not be described in detail here.

A semiconductor connection structure 100 is provided in one embodiment of the present invention. Referring to FIG. 6A to FIG. 6C simultaneously, the semiconductor connection structure 100 includes a substrate 102, a first trench 105, a metal line 106B, a work function layer 108, an insulating capping layer 112, and a contact structure 122.

The substrate 102 includes an array area and a peripheral area (not shown) surrounding the array area, and the array area includes a central region 10 and an edge region 20 surrounding the central region 10. The first trench 105 is formed in the substrate 102 and extends from the central region 10 to the edge region 20 along the first direction. The first trench 105 has a first portion 105A in the central region 10 and a second portion 105B in the edge region 20. The first width W1 of the first portion 105A is smaller than the second width W2 of the second portion 105B. The metal line 106B is formed in the first trench 105 and is located at the bottom of the first trench 105. The work function layer 108 is formed in the first trench 105 and is located on the metal line 106B. The contact structure 122 is formed in the first trench 105 of the edge region 20. In other words, the contact structure 122 is formed in the second portion 105B. The contact structure 122 is located on the metal line 106B and is in direct contact with the metal line 106B. The bottom portion of the contact structure 122 is surrounded by the work function layer 108, and the sidewall of the contact structure 122 is in direct contact with the sidewall of the work function layer 108.

Referring to FIG. 6C, two adjacent first trenches 105 constitute a pair of first trenches 105. In the pair of first trenches 105, the second portions 105B of the two first trenches 105 are located on opposite sides of the central region 10, respectively, seen from the top view along the first direction. For example, referring to the pair of first trenches 105 on the leftmost side of FIG. 6C, seen from the top view along the first direction, in the first trench 105 on the left side, the second portion 105B is located on the upper side of the central region 10. On the other hands, in the first trench 105 on the right side, the second portion 105B is located on the lower side of the central region 10.

In addition, in the present specification, the "spacing between adjacent first trenches 105" refers to the spacing between the first portion 105A of the first trench 105 and the first portion 105A of the adjacent first trench 105. Referring to FIG. 1C and FIG. 6C simultaneously, in the present embodiment, the spacing between all adjacent first trenches 105 is the same. More specifically, referring to the three first trenches 105 on the leftmost side of FIG. 6C, seen from the top view along the second direction, the spacing between the leftmost first trench 105 and the middle first trench 105 is a first spacing P1, and the spacing between the middle first trench 105 and the rightmost first trench 105 is also the first spacing P1. In the present embodiment, the spacing between all the first trenches 105 is uniform and fixed, which is advantageous for improving the control of the lithography process and the yield of the product.

In the manufacturing method of the semiconductor connection structure 100 provided in the present embodiment, by changing the shape of the word line trench in the top view, the word line contact structure can be formed in a self-aligned manner at the boundary region between the array area and the peripheral area. More specifically, referring to FIG. 2A, FIG. 2B, and FIG. 2C simultaneously, in different regions of the array area, the word line trench 105 has different widths. In the second direction (i.e., the X direction), the second width W2 of the second portion 105B is greater than the first width W1 of the first portion 105A. In other words, in the semiconductor connection structure 100 shown in FIG. 2C, the first trench 105 has a protruding portion in the edge region 20, and the protruding portion extends outwardly toward both sides of the first trench 105 along the second direction. Therefore, when the work function layer 108 has completely filled the first portion 105A, the second portion 105B is not completely filled, and a recess 105C with a smaller area is left in the second portion 105B. After the third etching process of FIG. 3C is performed, the work function layer 108 formed in the protruding portion of the first trench 105 surrounds the recess 105C, and the recess 105C exposes the top surface of the metal line 106B. Then, during the fifth etching process, a contact hole exposing the top surface of the metal line 106B may be formed in a self-aligned manner at the position corresponding to the recess 105C. Therefore, the lithography process for partially removing the work function layer can be omitted, and the position shift or size variation of the word line contact holes during the lithography process can be avoided, thereby greatly improving the yield and reliability of the product.

Referring to FIG. 1C, in order to ensure that the work function layer 108 forms a recess 105C which exposes the metal line 106B in the protruding portion of the first trench 105 (as shown in FIG. 3B), and makes the first trench 105 has an appropriate width to facilitate the subsequent filling of the filling material and the miniaturization of the memory device. The ratio W1W1 of the second width W2 to the first width W1 may be adjusted to a specific range. In one embodiment, the ratio W2/W1 of the second width W2 to the first width W1 is 1.5-4.0.

In addition, the protruding portion of the first trench 105 has a length L along the first direction. If the length L is too small (for example, the length L is less than the first width W1), it may still be difficult to form the recess 105C which exposes metal line 106B. On the other hand, if the length L is too large, it is disadvantageous to the miniaturization of the memory device. Therefore, the ratio L/W1 of the length L of the protruding portion to the first width W1 may be adjusted to a specific range. In one embodiment, the ratio L/W1 of the length L of the protruding portion to the first width W1 is 1.5-4.0.

Referring to FIG. 2A and FIG. 2B, before the first etching process, the work function layer 108 has a first thickness T1. In order to completely fill the first portion 105A and ensure that the work function layer 108 can form a recess 105C in the protruding portion of the first trench 105 to expose the metal line 106B, the ratio of the second width W2 to the first thickness T1 may be adjusted a specific range. In one embodiment, the ratio of the second width W2 to the first thickness T1 is 3.0-8.0. After the third etching process, the top surface of the exposed metal line 106B has a third width W3, as shown in FIG. 3B. The third width W3 is approximately the first thickness T1 minus twice the second width W2. Similarly, the length of the top surface of the exposed metal line 106B is approximately the length L minus twice the first thickness. Therefore, the exposed area of the metal line 106B can be controlled by adjusting the relative relationships between the second width W2, the length L, and the first thickness T1.

Referring to FIG. 4A and FIG. 4B, after the fourth etching process, the work function layer 108 located in the first trench 105 has a second thickness T2. The work function and electrical resistance value of the work function layer 108 can be controlled by adjusting the second thickness T2 of the work function layer 108. Therefore, the gate-induced drain leakage current of the memory cell located in the central region 10 can be reduced, and the performance of the memory device can be improved.

Referring to FIG. 6B, in the edge region 20, the contact structure 122 is located on the metal line 106B and is in direct contact with the metal line 106B. The electrical resistance value of the metal line 106B is lower than the electrical resistance value of the work function layer 108. Therefore, the structure shown in FIG. 6B can further improve the performance of the memory device.

Figure 7:
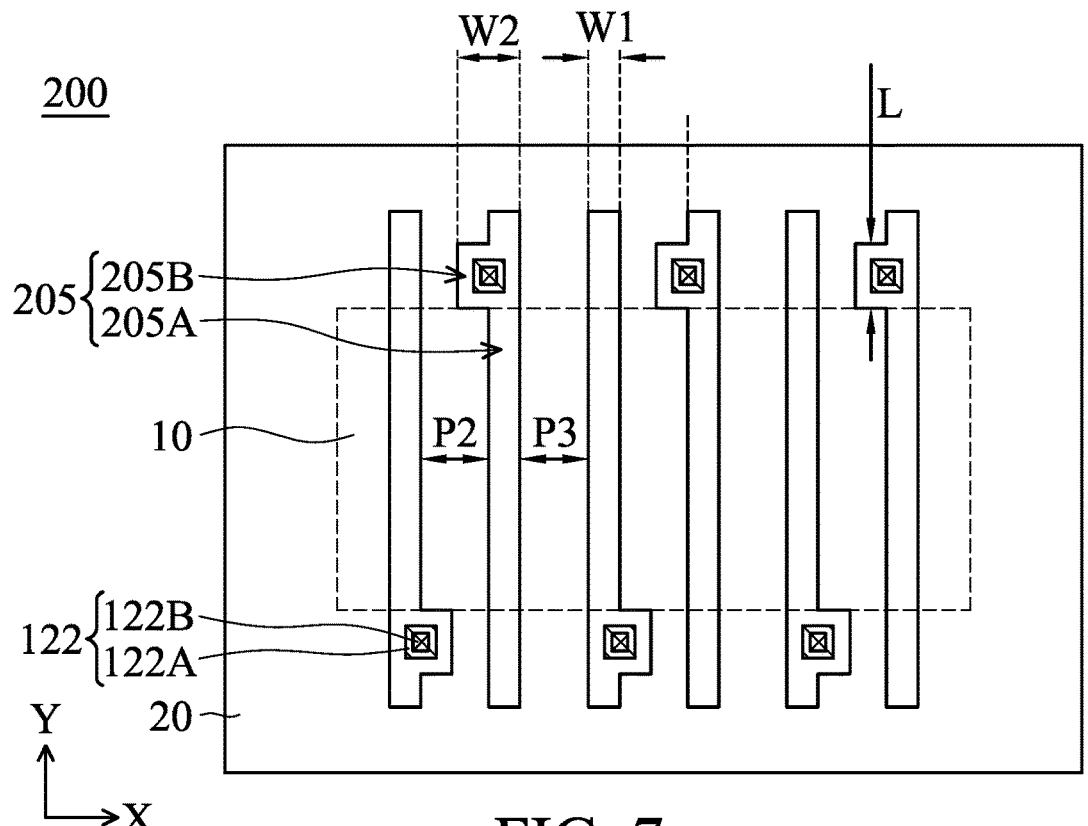
FIG. 7 is a top view of corresponding to a semiconductor connection structure in accordance with another embodiment of the present invention.

FIG. 7 is a top view of corresponding to a semiconductor connection structure 200 in accordance with another embodiment of the present invention. The semiconductor connection structure 200 shown in FIG. 7 is similar to the semiconductor connection structure 100 shown in FIG. 6C, and the difference is that the first trench has different shape. In order to simplify the description, in FIG. 7, the elements that are the same as those shown in FIG. 6C and the forming process steps thereof will not be described in detail here.

In FIG. 7, two adjacent first trenches 205 constitute a pair of first trenches 105. In FIG. 7, in the pair of first trenches 205, the protruding portions of the two first trenches 105 extend in opposite directions along the second direction. For example, referring to the pair of first trenches 205 on the leftmost side of FIG. 7, in the first trench 205 on the left side, the protruding portion extends toward the right side of the first trench 205 along the second direction. On the other hand, in the first trench 205 on the right side, the protruding portion extends toward the left side of the first trench 205 along the second direction. In the present embodiment, the contact structure 122 is shift from the center of the first trench 205 to the outside. Therefore, the distance between the contact structure 122 and the memory cell in the central region 10 can be slightly increased. As a result, the electrical interference can be reduced and the performance of the memory device can be further improved.

Further tore, referring to FIG. 7, in the present embodiment, the distances between adjacent first trenches 205 are different. More specifically, referring to the three first trenches 205 on the leftmost side of FIG. 7, seen from the top view along the second direction, the spacing between the leftmost first trench 205 and the middle first trench 205 is a second spacing P2, and the spacing between the middle first trench 205 and the rightmost first trench 205 is a third spacing P3. In the present embodiment, since there is no protruding portion between the middle first trench 205 and the rightmost first trench 205, the third spacing P3 may be smaller than or equal to the second spacing P2. As a result, it will be advantageous for the miniaturization of memory devices.

Figure 8:
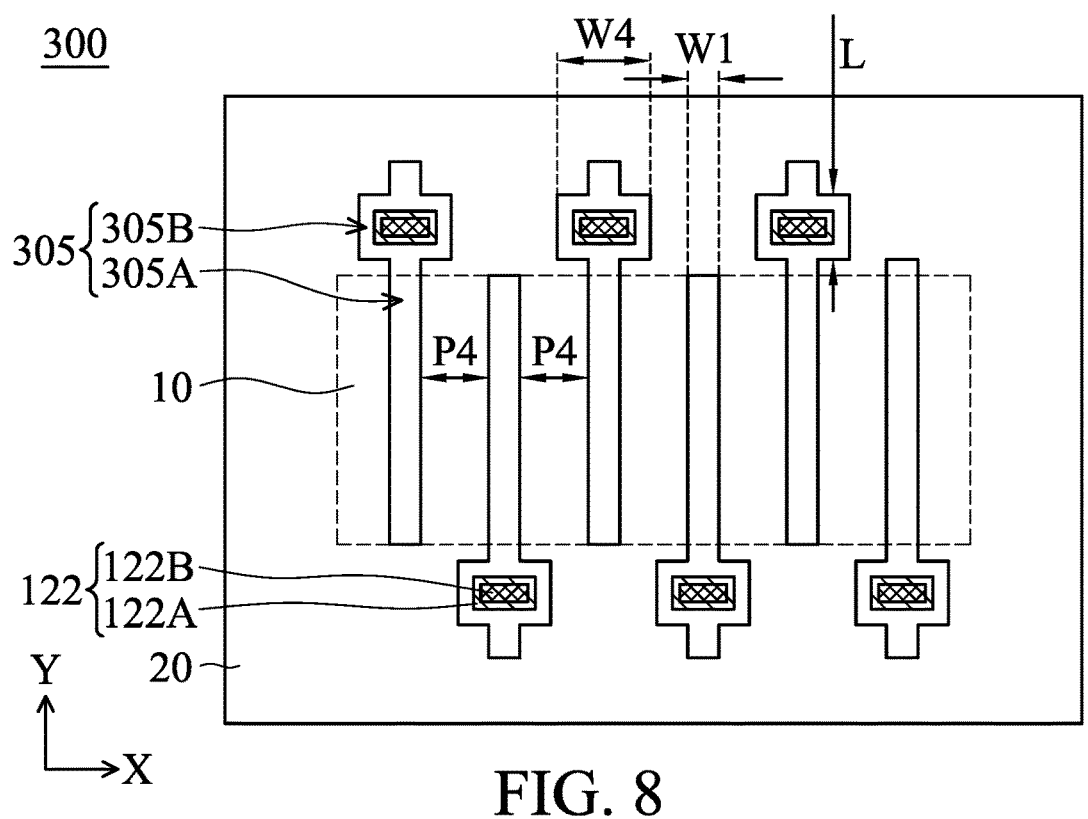
FIG. 8 is a top view of corresponding to a semiconductor connection structure in accordance with another embodiment of the present invention.

FIG. 8 is a top view of corresponding to a semiconductor connection structure 300 in accordance with another embodiment of the present invention. The semiconductor connection structure 300 shown in FIG. 8 is similar to the semiconductor connection structure 100 shown in FIG. 6C, and the difference is that the first trench has different shape. In order to simplify the description, in FIG. 8, the elements that are the same as those shown in FIG. 6C and the forming process steps thereof will not be described in detail here.

In FIG. 8, two adjacent first trenches 305 constitute a pair of first trenches 305, and each first trench 305 has only one end portion extending into the edge region 20. For example, referring to the pair of first trenches 305 on the leftmost side of FIG. 8, in the first trench 305 on the left side, the first end portion (the upper end portion) is located in the edge region 20, and the second end portion (the lower end portion) is located in the central region 10. On the other hand; in the first trench 305 on the right side, the first end portion (the upper end portion) is located in the central region 10, and the second end portion (the lower end portion) is located in the edge region 20.

Referring to FIG. 8, the second portion 305B of the first trench 305 has a fourth width W4. In the present embodiment, since only one end portion of each first trench 305 extends into the edge region 20, the fourth width W4 may be greater than the second width W2 of FIG. 1C, so that the margin of the formation of the contact hole in the third etching process increases. Therefore, it is advantageous for improving the yield of the memory device. In one embodiment, the ratio W4/W1 of the fourth width W4 to the first width W1 is 1.5-6.0.

On the other hand, in the present embodiment, the spacing between all adjacent first trenches 305 is the same. Referring to FIG. 8, seen from the top view along the second direction, the spacing between the adjacent first trenches 105 is a fourth spacing P4. In the present embodiment, since only one end portion of each first trench 305 extends into the edge region 20, the fourth spacing P4 may be smaller than the first spacing P1 in FIG. 1C, which is advantageous for the miniaturization of the memory device. In the present embodiment, the fourth width W4 of the first trench 305 and the first width W1 have a difference (W4-W1), and the ratio P4/(W4-W1) of the fourth spacing P4 to this difference is 0.5-1.5.

Figure 9:
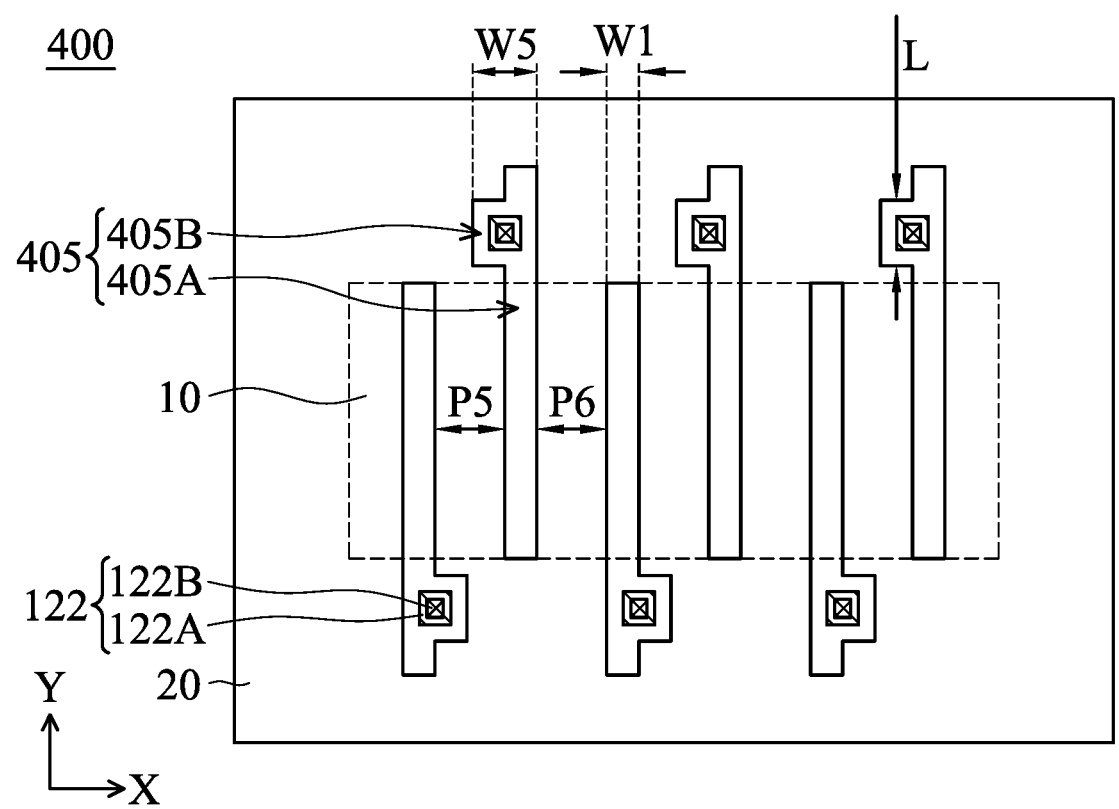
FIG. 9 is a top view of corresponding to a semiconductor connection structure in accordance with another embodiment of the present invention.

FIG. 9 is a top view of corresponding to a semiconductor connection structure 400 in accordance with another embodiment of the present invention. The semiconductor connection structure 400 shown in FIG. 9 is similar to the semiconductor connection structure 200 shown in FIG. 7, and the difference is that the first trench has different shape. In order to simplify the description, in FIG. 9, the elements that are the same as those shown in FIG. 6C and the forming process steps thereof will not be described in detail here.

In FIG. 9, two adjacent first trenches 405 constitute a pair of first trenches 405, and each first trench 405 has only one end portion extending into the edge region 20. The second portion 405B of the first trench 405 has a fifth width W5. In the present embodiment, since only one end portion of each first trench 405 extends into the edge region 20, the fifth width W5 may be greater than the second width W2 of FIG. 1C, so that the margin of the formation of the contact hole in the third etching process increases. Therefore, it is advantageous for improving the yield of the memory device. In one embodiment, the ratio W5/W1 of the fifth width W5 to the first width W1 is 1.5-6.0.

On the other hand, referring to the three first trenches 405 on the leftmost side of FIG. 9, seen from the top view along the second direction, the spacing between the leftmost first trench 405 and the middle first trench 405 is a fifth spacing P5, and the spacing between the middle first trench 405 and the rightmost first trench 405 is a sixth spacing P6. In the present embodiment, since only one end portion of each first trench 405 extends into the edge region 20, the fifth spacing P5 may be smaller than the first spacing P1 of FIG. 1C, which is advantageous for the miniaturization of the memory device. In addition, similar to FIG. 7, in the present embodiment, since there is no protruding portion between the middle first trench 405 and the rightmost first trench 405, the sixth spacing P6 may be smaller than or equal to the fifth spacing P5. As a result, it will be advantageous for miniaturization of memory devices. In the present embodiment, the fifth width W5 of the first trench 405 and the first width WI have a difference (W5-W1), and the ratio P5/(W5-W1) of the fifth spacing P5 to this difference is 0.1-1.5.

It should be noted that the shapes of the trenches shown in FIG. 6C and FIG. 7 to FIG. 9 are merely for the purpose of illustration, and are not intended to limit the present invention. In more detail, after the first portion of the trench has been filled with the work function layer, the recess or the opening can still be formed in the second portion of the trench. In the present embodiment, the second portion of the trench is rectangular or approximately rectangular. In other embodiments, the second portion of the trench may be trapezoidal, rhombus, parallelogram, polygon, circle, ellipse, shape similar to the above-mentioned shapes, or irregular shape. Furthermore, in the present specification, the width of the first portion and the width of the second portion refer to the maximum width measured along the second direction (i.e., the direction perpendicular to the extending direction of the trench). In other embodiments, the trenches shown in FIG. 6C and FIG. 7 to FIG. 9 may be arranged or combined arbitrarily according to actual needs.

In summary, in the manufacturing method of the semiconductor connection structure 100 provided by the embodiments of the present invention, by changing the shape of the word line trench in the top view, the word line contact structure can be formed in a self-aligned manner at the boundary region between the array area and the peripheral area. Therefore, the lithography process for partially removing the work function layer can be omitted, and the position shift or size variation of the word line contact holes during the lithography process can be avoided. As a result, the yield and reliability of the memory device can be greatly improved. Furthermore, in the manufacturing method of the semiconductor connection structure provided by the embodiments of the present invention, at least one photomask can be omitted. Therefore, the manufacturing cost and the complexity of the manufacturing process can be greatly reduced. In addition, such a manufacturing method can be easily integrated into an existing manufacturing process without additional replacement or modification of production equipment.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A semiconductor connection structure, comprising:
    a substrate comprising an array area, wherein the array area comprises a central region and an edge region surrounding the central region;
    a first trench formed in the substrate, wherein the first trench extends from the central region to the edge region along a first direction, wherein the first trench has a first portion in the central region, the first trench has a second portion in the edge region, and a first width of the first portion is smaller than a second width of the second portion;
    a metal line formed in the first trench;
    a work function layer formed in the first trench, wherein the work function layer is located on the metal line; and
    a contact structure formed in the first trench within the edge region, wherein the contact structure is located on the metal line and is in direct contact with the metal line, and wherein a bottom portion of the contact structure is surrounded by the work function layer.

2. The semiconductor connection structure as claimed in claim 1, wherein a sidewall of the contact structure is in direct contact with a sidewall of the work function layer.

3. The semiconductor connection structure as claimed in claim 1, wherein the first trench has a protruding portion in the edge region, and the protruding portion extends toward both sides of the first trench along a second direction perpendicular to the first direction.

4. The semiconductor connection structure as claimed in claim 3, wherein the protruding portion extends toward a side of the first trench along the second direction.

5. The semiconductor connection structure as claimed in claim 1, further comprising:
    a second trench formed in the substrate and adjacent to the first trench, wherein the second trench extends from the central region to the edge region along the first direction, wherein the second trench has a third portion in the central region, the second trench has a fourth portion in the edge region, and a third width of the third portion is smaller than a fourth width of the fourth portion.

6. The semiconductor connection structure as claimed in claim 5, wherein the second portion of the first trench and the fourth portion of the second trench are located on opposite sides of the central region when seen from the top view along the first direction.

7. The semiconductor connection structure as claimed in claim 1, wherein a first end portion of the first trench is located in the edge region, and a second end portion of the first trench is located in the central region.

8. The semiconductor connection structure as claimed in claim 1, wherein a ratio of the second width to the first width is 1.5-4.0.

9. The semiconductor connection structure as claimed in claim 3, wherein the protruding portion has a length along the first direction, and a ratio of the length to the first width is 1.5-4.0.

10. A method for manufacturing a semiconductor connection structure, comprising:
    providing a substrate comprising an array area, wherein the array area comprises a central region and an edge region surrounding the central region;
    forming a first trench in the substrate, wherein the first trench extends from the central region to the edge region along a first direction, wherein the first trench has a first portion in the central region, the first trench has a second portion in the edge region, and a first width of the first portion is smaller than a second width of the second portion;

forming a metal line in the first trench;

forming a work function layer in the first trench, wherein the work function layer is located on the metal line; and forming a contact structure in the first trench within the edge region, wherein the contact structure is located on the metal line and is in direct contact with the metal line, and wherein a bottom portion of the contact structure is surrounded by the work function layer.

11. The method for manufacturing the semiconductor connection structure as claimed in claim 10, wherein forming the work function layer in the first trench comprises:

conformally forming the work function layer on the substrate, wherein the work function layer completely fill the first portion, and the work function layer forms a recess in the second portion; and performing a first etching process to remove a portion of the work function layer, wherein after the first etching process, the metal line located under the recess is exposed.

12. The method for manufacturing the semiconductor connection structure as claimed in claim 11, wherein before the first etching process, the work function layer has a first thickness, and a ratio of the second width to the first thickness is 3.0-8.0.

* * * * *